United States Patent
Alptekin et al.

(10) Patent No.: US 8,603,915 B2
(45) Date of Patent: Dec. 10, 2013

(54) MULTI-STAGE SILICIDATION PROCESS

(75) Inventors: Emre Alptekin, Wappingers Falls, NY (US); Ahmet S. Ozcan, Pleasantville, NY (US); Viraj Y. Sardesai, Poughkeepsie, NY (US); Cung D. Tran, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 93 days.

(21) Appl. No.: 13/305,122

(22) Filed: Nov. 28, 2011

(65) Prior Publication Data

US 2013/0137260 A1    May 30, 2013

(51) Int. Cl.
    *H01L 21/44*    (2006.01)
(52) U.S. Cl.
    USPC ............... 438/674; 438/682; 438/664
(58) Field of Classification Search
    None
    See application file for complete search history.

(56) References Cited

U.S. PATENT DOCUMENTS

| | | |
|---|---|---|
| 6,218,276 B1 | 4/2001 | Liu et al. |
| 6,235,566 B1 | 5/2001 | Wu |
| 7,396,767 B2 | 7/2008 | Wu et al. |
| 7,662,716 B2 | 2/2010 | Kim et al. |
| 7,816,219 B2 | 10/2010 | Chen et al. |
| 7,859,059 B2 | 12/2010 | Takahashi |
| 2006/0244075 A1 | 11/2006 | Chen et al. |
| 2009/0096108 A1 | 4/2009 | Li et al. |
| 2009/0191684 A1 | 7/2009 | Shue et al. |
| 2010/0311231 A1 | 12/2010 | Thei et al. |
| 2011/0076843 A1 | 3/2011 | Huang et al. |
| 2011/0079829 A1 | 4/2011 | Lai et al. |
| 2011/0079846 A1 | 4/2011 | Yao et al. |
| 2011/0081774 A1 | 4/2011 | Yeh et al. |

OTHER PUBLICATIONS

Ding-Yu et al. "Schottky barrier MOSFET structure with silicide source/drain on buried metal*" vol. 16, No. 1, pp. 240-244, Jan. 2007. Chin. Phys. Soc. and IOP Publishing Ltd., Copyright 2007.

Timans et al. "Advanced Gate Stack, Source/Drain, and Channel Engineering for Si-Based CMOS 4: New Materials, Processes, and Equipment" ECS Transactions, vol. 13, No. 1, Published by the Electrochemical Society, Apr. 2008.

Zhu et al. "N-Type Schottky Barrier Source/Drain MOSFET Using Ytterbium Silicide" IEEE Electron Device Letters, vol. 25, No. 8, pp. 565-567, Aug. 2004.

*Primary Examiner* — Scott B Geyer
(74) *Attorney, Agent, or Firm* — Jason H. Sosa; Yuanmin Cai

(57) ABSTRACT

A multi-stage silicidation process is described wherein a dielectric etch to expose contact regions is timed to be optimal for a highest of the contact regions. After exposing the highest of the contact regions, a silicide is formed on the exposed contact region and the dielectric is re-etched, selective to the formed silicide, to expose another contact region, lower than the highest of the contact regions, without recessing the highest of the contact regions. The process then forms a silicide on the lower contact region. The process may continue to varying depths. Each subsequent etch is performed without the use of additional masking steps. By manipulating diffusive properties of existing silicides and deposited metals, the silicides formed on contact regions with differing depths/height may comprise different compositions and be optimized for different polarity devices such as nFET and pFET devices.

18 Claims, 3 Drawing Sheets

MULTI-STAGE SILICIDATION PROCESS

FIELD OF THE INVENTION

This disclosure relates generally to semiconductor devices and more specifically to the formation of silicides on conductive features of semiconductor devices.

BACKGROUND OF THE INVENTION

The fabrication of semiconductor devices involves forming electronic components in and on semiconductor substrates, such as silicon wafers. These electronic components may include one or more conductive layers, one or more insulation layers, and doped regions formed by implanting various dopants into portions of a semiconductor substrate to achieve specific electrical properties. Semiconductor devices include transistors, resistors, capacitors, and the like, with intermediate and overlying metallization patterns at varying levels, separated by dielectric materials, which interconnect the semiconductor devices to form integrated circuits.

Silicides (metal-semiconductor alloys) are used in the semiconductor industry to enhance signal propagation through transistors and other conductive features of semiconductor devices. A silicide has a lower resistance than the underlying doped silicon or poly. As a result, contact resistance is reduced and signal propagation through the semiconductor device is enhanced.

Current nanoscale semiconductor devices employ embedded conductive regions, such as source/drain (S/D) regions for a field effect transistor (FET). For different device regions and various devices (e.g., nFET, pFET), these embedded conductive regions may be grown with different overfills. For example, S/D regions in one device region may be raised above a semiconductor substrate farther than S/D regions in a second device region. In another example, S/D regions in the second device region may not be raised above the substrate at all.

Since known etching methods have poor selectivity to typical semiconductor substrates (e.g., Si, SiGe, SiC), to expose conductive regions of a plurality of semiconductor devices in a substrate, a timed etch, such as a reactive-ion etch (RIE), is used, with the time determined by the lowest of the conductive regions to ensure that good contact is made to all conductive regions. A consequence of this is that the conductive regions with a higher overfill end up with significant recessing that can cause device performance degradation and/or high junction leakage.

The characteristics of the silicide, e.g., thickness, resistance, and the like, may be controlled through various parameters such as the type of metal, annealing time and temperature, etc.

SUMMARY

One aspect of an embodiment of the present invention discloses a method for forming silicides on a plurality of device contact regions with different overfill heights. The method comprises forming a dielectric layer over the plurality of device contact regions on a semiconductor substrate. The method further comprises etching contact openings into the dielectric layer over each of the plurality of device contact regions to a depth sufficient to expose at least one of the plurality of device contact regions, but insufficient to expose at least one other of the plurality of device contact regions. The method further comprises forming a first silicide on the at least one of the plurality of device contact regions. The method further comprises extending the contact openings in the dielectric layer, via an etch selective to the first silicide on the at least one of the plurality of device contact regions, to expose the at least one other of the plurality of device contact regions, and forming a second silicide on the at least one other of the plurality of device contact regions.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Figure 1:
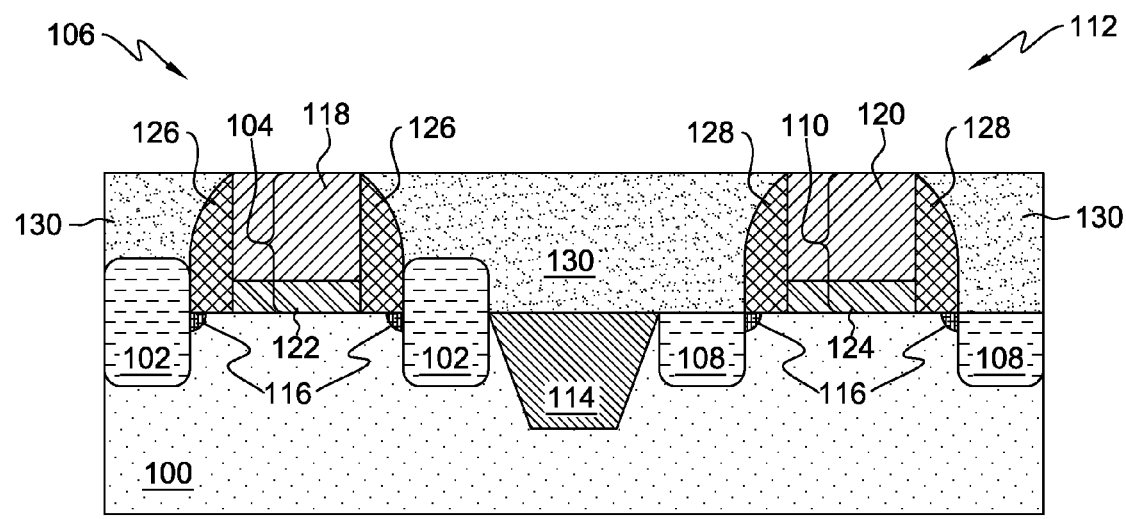
FIG. 1 depicts two conventional transistor structures comprising respective source/drain regions on opposite sides of respective gate stacks, separated by an isolation region and covered by a dielectric layer.

Detailed embodiments of the claimed structures and methods are disclosed herein. The method steps described below do not form a complete process flow for manufacturing integrated circuits. The present embodiments can be practiced in conjunction with the integrated circuit fabrication techniques currently used in the art, and only so much of the commonly practiced process steps are included as are necessary for an understanding of the described embodiments. The figures represent cross-section portions of a semiconductor chip or a substrate during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

Sequential steps of an exemplary embodiment of the method of performing a multi-stage silicidation process on semiconductor devices is described below with respect to the schematic illustrations of FIGS. 1-6. Similar reference numerals denote similar features.

Referring first to FIG. 1, two conventional transistor structures are shown comprising a substrate 100 doped with either an N-type impurity or P-type impurity, raised source/drain regions 102 on opposite sides of gate stack 104 to form field effect transistor (FET) 106, and source/drain regions 108 on opposite sides of gate stack 110 to form FET 112. FET 106 and FET 112 are separated by isolation region 114. Although the present disclosure provides details concerning forming silicides on contact regions (such as source/drain regions 102 and 108) of FETs 106 and 112, the process disclosed herein may form silicides on contact regions of any number of semiconductor devices including, but not limited to, memory devices, resistors, diodes, capacitors, complementary metal oxide semiconductor (CMOS) devices, bipolar junction transistor (BJT) semiconductor devices, schottky barrier semiconductor devices, and finFET semiconductor devices.

Substrate 100 may be composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. Semiconductor substrate 100 may also be composed of other semiconductor materials, such as germanium, and compound semiconductor substrates, such as type III/V semiconductor substrates, e.g., GaAs. Although semiconductor substrate 100 is depicted as a bulk semiconductor substrate, semiconductor on insulator (SOI) substrate arrangements, such as silicon on insulator substrates, are also suitable for semiconductor substrate 100.

As is common, source/drain regions 102 and 108 have a conductivity opposite to that of substrate 100. Doped P-wells or N-wells (not shown) may be used to adjust the conductivity of substrate 100 in various device regions. Source/drain regions 102 are "raised" source/drain regions wherein a portion of the respective source/drain region rises out of semiconductor substrate 100 and another portion of the respective source/drain region resides within semiconductor substrate 100. Source/drain regions 108 do not rise above the surface of substrate 100. In another embodiment, source/drain regions 108 may be raised source/drain regions, but raised to a different height than source/drain regions 102. A portion of a source/drain region raised above the substrate may be referred to as an "overfill". Each of source/drain regions 102 and source/drain regions 108 may include extension dopant regions 116, decreasing channel length for FETs 106 and 112, respectively.

Gate stacks 104 and 110 include respective gate conductors 118 and 120 atop respective gate dielectrics 122 and 124. Gate conductors 118 and 120 may be metal gate electrodes. Gate conductors 118 and 120 may be composed of any conductive metal including, but not limited to, W, Ni, Ti, Mo, Ta, Cu, Pt, Ag, Au, Ru, Ir, Rh, and Re, and alloys that include at least one of the aforementioned conductive elemental metals. In another embodiment, gate conductors 118 and 120 may also be composed of a doped semiconductor material, such as n-type doped polysilicon. Gate dielectrics 122 and 124 may be a dielectric material, such as $SiO_2$, or alternatively a high-k dielectric, such as oxides of Hf, Ta, Zr, Al or combinations thereof. In another embodiment, gate dielectrics 122 and 124 are comprised of an oxide, such as $ZrO_2$, $Ta_2O_5$ or $Al_2O_3$. In one embodiment, gate dielectrics 122 and 124 have a thickness ranging from 1 nm to 10 nm. In another embodiment, the gate dielectrics 122 and 124 have a thickness ranging from 1.0 nm to 2.0 nm.

In an alternative embodiment, gate stacks 104 and 110 may be sacrificial gate stacks to be subsequently removed in a replacement gate process. Sacrificial gate material may be any material, such as polysilicon, that may be etched selectively to a surface of substrate 100.

Spacers 126 and 128 may be in direct contact with the sidewalls of respective gate stacks 104 and 110. Spacers 126 and 128 typically have a width ranging from 2.0 nm to 15.0 nm, as measured from the sidewall of respective gate stack 104 and 110. Spacers 126 and 128 may be composed of a dielectric, such as a nitride, oxide, oxynitride, or a combination thereof.

Dielectric layer 130 is formed over FETs 106 and 112. Dielectric layer 130 may be composed of any dielectric material including, but not limited to, oxides, nitrides, oxynitrides, silicate glass and combinations thereof. In one example, dielectric layer 130 may be composed of a silicon nitride film. In another example, dielectric layer 130 is composed of a silicon oxide film. In yet another example, dielectric layer 130 comprises a film stack consisting of a silicon nitride film and a silicon oxide film. The upper surface of dielectric layer 130 may be coplanar with an upper surface of gate stacks 104 and 110. In another embodiment, dielectric layer 130 is present on the upper surfaces of gate stacks 104 and 110.

Although only two semiconductor devices (FET 106 and FET 112) are shown on substrate 100, any number of semiconductor devices may be formed on substrate 100 with any number of varied contact region overfills in various embodiments.

Figure 2:
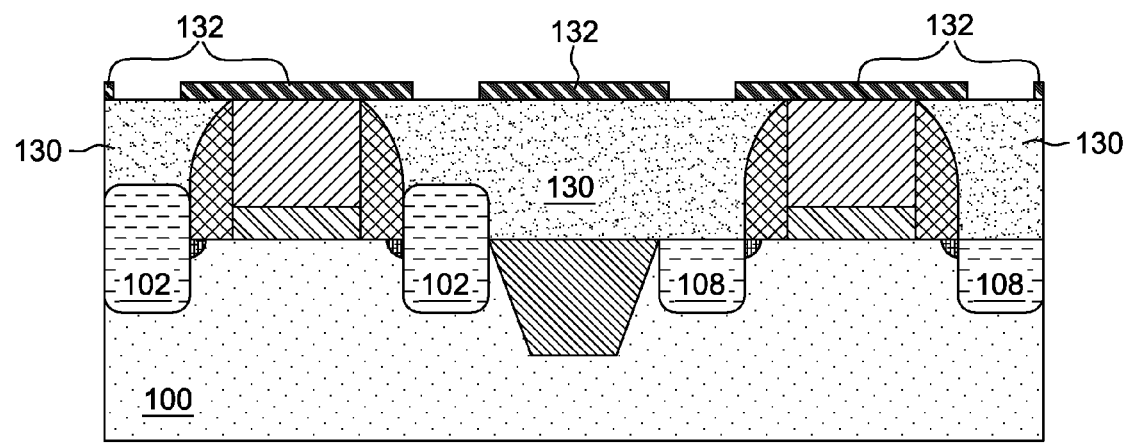
FIG. 2 depicts the deposition of an etch mask over the dielectric layer of FIG. 1 exposing areas of the dielectric layer over the respective source/drain regions of FIG. 1.

FIG. 2 depicts the deposition of etch mask 132 over dielectric layer 130 to expose areas of dielectric layer 130 over source/drain regions 102 and 108. Etch mask 132 may comprise any etch resistant material. For example, a photoresist etch mask can be produced by applying a photoresist layer to the upper surface of dielectric layer 130, exposing the photoresist layer to a pattern of radiation, and then developing the pattern into the photoresist layer utilizing a resist developer. The photoresist etch mask may be positioned so that portions of dielectric layer 130 are not protected by the photoresist etch mask. Alternatively, a photoresist etch mask may be deposited over a hardmask and used to etch openings into the hardmask. The hardmask would serve as etch mask 132 for subsequent etch processes. A hardmask may be preferable as it is not as easily degraded during etch processes such as plasma etching. A hardmask may be made up of, by way of example, titanium nitride, silicon nitride, silicon dioxide, silicon carbide, silicon carbide nitride and/or combinations of the preceding.

Figure 3:
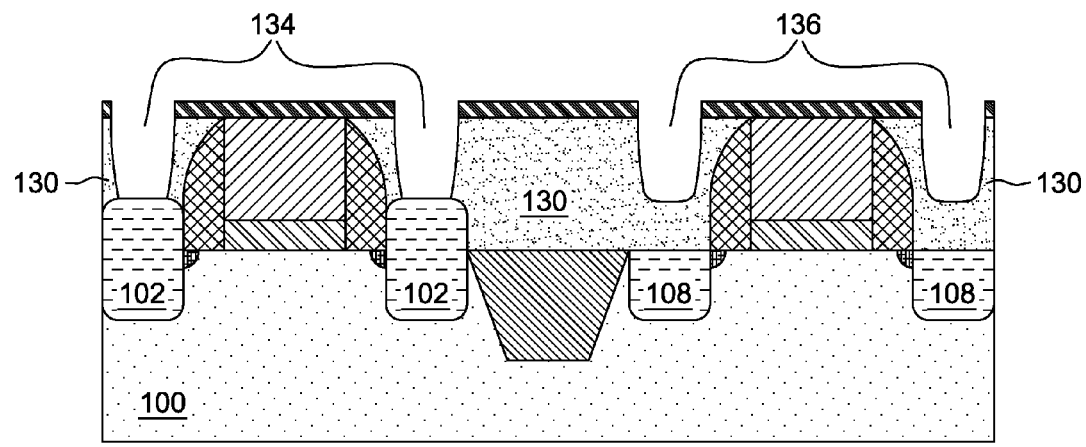
FIG. 3 depicts the dielectric layer of FIG. 1 etched to form contact openings through the dielectric layer and expose the higher of the source/drain regions from FIG. 1.

As depicted in FIG. 3, dielectric layer 130 is etched to form contact openings (e.g., contact openings 134 and 136) through dielectric layer 130 and expose source/drain regions 102. Contact openings 134 and 136 may be formed using photolithography and etch processes.

The exposed portions of dielectric layer 130 are removed by a selective etch. However, known etch processes have poor selectivity to substrate materials, such as Si, SiGe, and SiC, and the depth of the etch is largely determined by a time of exposure to the etch process. The etch process may be an anisotropic etch or an isotropic etch. The anisotropic etch may include reactive-ion etching (RIE). Other examples of anisotropic etching that can be used at this point of the present disclosure include ion beam etching, plasma etching or laser ablation. An isotropic etch, such as a wet chemical etch, removes the material being etched at the same rate in each direction. Isotropic etch processes are contrary to anisotropic etch processes, which preferentially etch in one direction, such as with a reactive ion etch (RIE).

Traditionally, the etch process was set to a time optimized for the lowest contact region, in the depicted example, source/drain regions 108. At the point that the lowest contact region would be exposed, higher contact regions (regions with greater overfill) such as source/drain regions 102 would be significantly recessed. Contrary to the traditional approach, the depicted etch process is set to a time optimized for the higher of the contact regions, source/drain regions 102, leaving source/drain regions 108 at least partially covered by dielectric layer 130.

Figure 4:
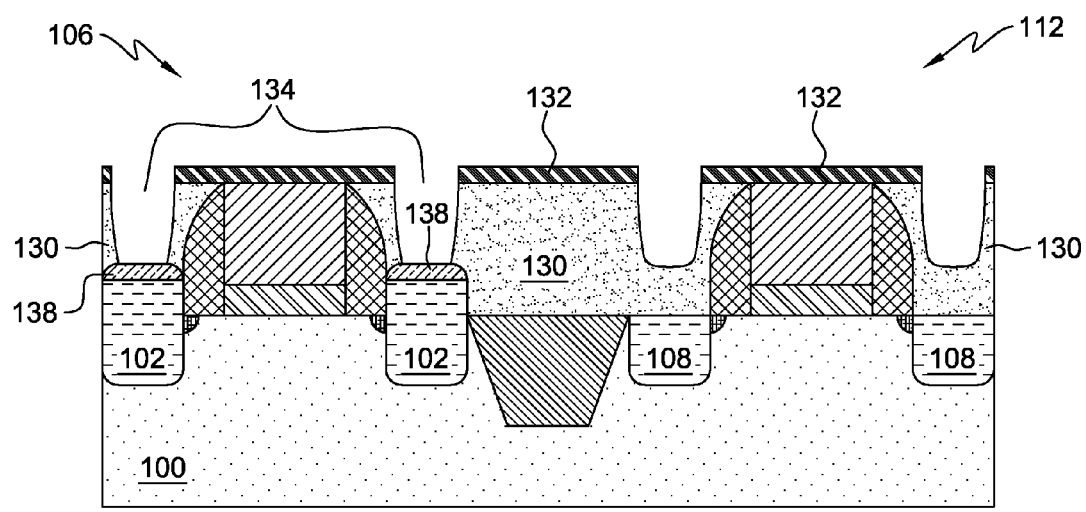
FIG. 4 depicts the formation of a silicide on the exposed source/drain regions from FIG. 3, in accordance with an embodiment of the present invention.

FIG. 4 depicts the formation of silicide 138 within contact openings 134, in accordance with an embodiment of the present invention.

A silicide structure is created through thermal diffusion that is induced by annealing metal and semiconductor containing materials that are in contact to produce a homogenous mixture or solid solution. In one embodiment of the present disclosure, a metal containing layer is deposited over FETs 106 and 112 including over source/drain regions 102 exposed through contact openings 134. During the annealing process metal elements from the metal containing layer are diffused into a portion of source/drain regions 102 to form silicide 138.

The metal containing layer may be deposited using physical vapor deposition (PVD) methods or chemical vapor deposition (CVD) methods. Examples of physical vapor deposition (PVD) techniques that are suitable for forming the metal containing layer include sputtering and plating. As used herein, "sputtering" means a method of depositing a film of material on a semiconductor surface. A target of the desired material, i.e., source/drain regions 102, is bombarded with particles, e.g., ions, which knock atoms from the target, and the dislodged target material deposits on the semiconductor surface. Examples of sputtering apparatuses include DC diode type systems, radio frequency (RF) sputtering, magnetron sputtering, and ionized metal plasma (IMP) sputtering. In different embodiments, the metal containing layer may be conformal or non-conformal. The term "conformal" denotes a layer having a thickness that does not deviate by more than 20% of an average value for the thickness of the layer.

In one example, the metal containing layer may be composed of nickel or nickel platinum alloy. The metal containing layer may also include at least one of nickel (Ni), cobalt, (Co), tungsten (W), titanium (Ti), tantalum (Ta), aluminum (Al), platinum (Pt) and combinations thereof. The metal containing layer may have a thickness ranging from 5 nm to 20 nm. In another embodiment, the metal containing layer may have a thickness ranging from 6 nm to 15 nm.

Following deposition of the metal containing layer, the entire structure is subjected to an annealing step including, but not limited to, rapid thermal annealing. During annealing, the deposited metal containing layer reacts with the semiconductor material of source/drain regions 102 forming a silicide 138. A typical thermal anneal is completed at a temperature ranging from 350° C. to 600° C. for a time period ranging from 1 second to 90 seconds. Following thermal anneal, the non-reacted portion of the metal containing layer is removed. The non-reacted portion of the metal containing layer may be removed by an etch process that is selective to silicide 138. The etch process may optionally remove etch mask 132.

In an alternate embodiment, a semiconductor containing material may be deposited on source/drain regions 102 prior to the metal containing layer.

Figure 5:
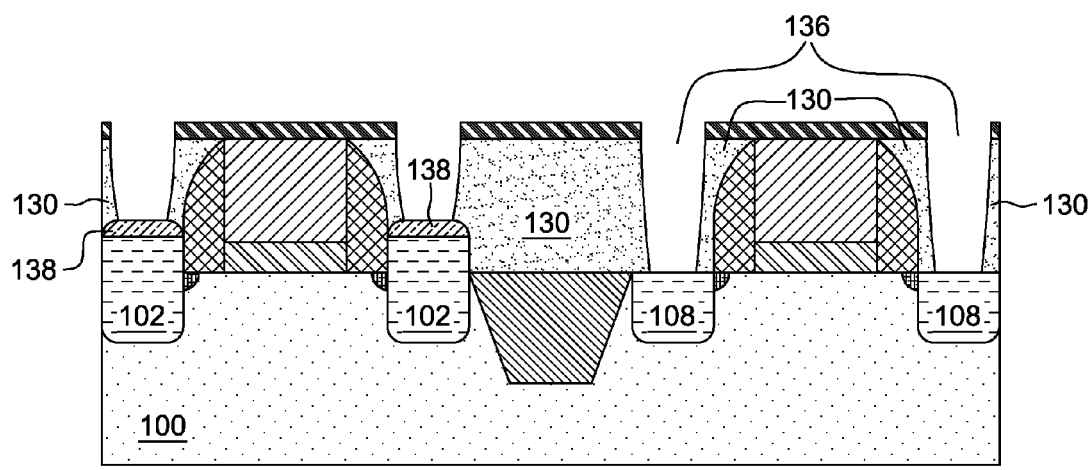
FIG. 5 depicts the exposure of the lower of the source/drain regions from FIG. 1.

FIG. 5 depicts the exposure of source/drain regions 108. Dielectric layer 130 is exposed to a subsequent etch process, such as a RIE, for a time optimized to extend contact opening 136 to expose source/drain regions 108 and selective to silicide 138. No intermediate masking steps are performed. Because silicides have a higher selectivity than typical substrates, the recessing into source/drain regions 102 is reduced or eliminated.

Figure 6:
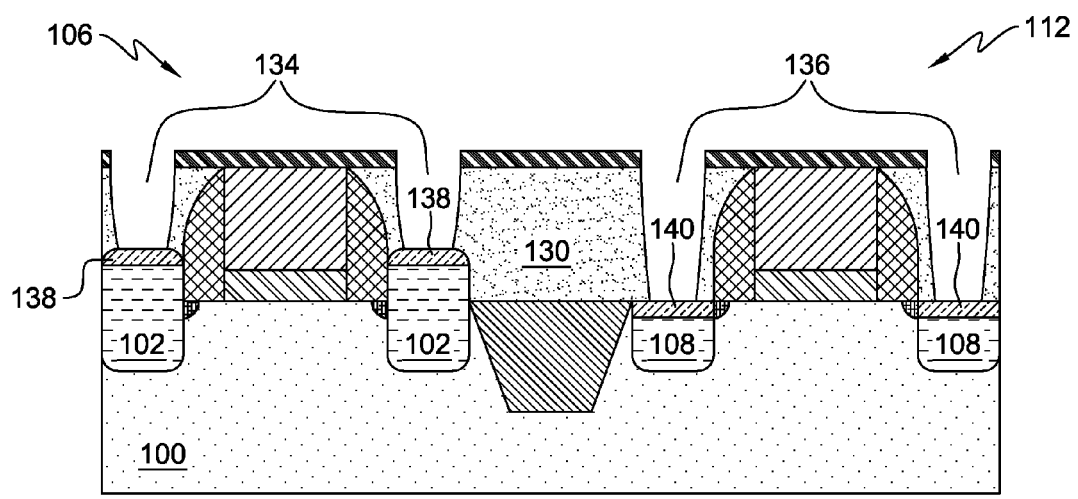
FIG. 6 depicts the formation of a silicide on the exposed source/drain regions of FIG. 5, in accordance with an embodiment of the present invention.

FIG. 6 depicts the formation of silicide 140 over source/drain regions 108, in accordance with an embodiment of the present invention.

Similar to the process of forming silicide 138, a metal containing layer is deposited over FETs 106 and 112 and over source/drain regions 108. A thermal anneal allows the metal to diffuse into the semiconductor containing material of source/drain regions 108, to create silicide 140. The non-reacted portion of the metal containing layer is removed.

In one embodiment a similar metal containing layer may be used for both of silicides 138 and 140. In such an embodiment, silicide 138 may receive more metal atoms from the metal containing layer used to create silicide 140.

In an alternate embodiment, it may be desirable to have silicides 138 and 140 composed of different metals. For example, a valence band edge silicide such as platinum silicide (PtSi), iridium silicide (IrSi), or nickel platinum silicide (NiPtSi) is desirable for pFET devices. A conduction band edge silicide such as erbium silicide (ErSi) or ytterbium silicide (YbSi) is desirable for nFET devices. For discussion purposes, FET 106 represents an nFET device and FET 112 represents a pFET device. When forming silicide 138, the metal containing layer may contain Er, which is annealed to form silicide 138 as ErSi on source/drain regions 102. Source/drain regions 108 are protected by dielectric layer 130 and the remainder of the Er containing layer is removed. Subsequent to the etch exposing source/drain regions 108, a metal containing layer is deposited that may contain Ni and Pt. The Ni and Pt containing layer is over source/drain regions 108 and silicide 138 on source/drain regions 102. It would be undesirable to diffuse Ni and Pt into silicide 138 in this example. However, because silicide 138 is less diffusive than the semiconductor containing material of source/drain regions 108, a two-step silicidation process may be used where a low-temperature anneal diffuses Ni and Pt atoms into source/drain regions 108, but is not hot enough to diffuse Ni and Pt atoms into silicide 138. Excess metal is stripped and after silicide 138 is cleared of the metal containing layer, a high temperature anneal is used to complete silicide 140 as NiPtSi on source/drain regions 108 without affecting silicide 138.

As an alternative, or in addition to, a two-step silicidation process on silicide 140, metal elements with different diffusive properties may be used in the respective metal containing layers used to create silicide 138 and 140. For example, tungsten diffuses into a semiconductor containing material at around 800 C to form a tungsten silicide. Nickel is highly diffusive, forming nickel silicide anywhere from 350 C. In such an embodiment, if silicide 138 is created first as a tungsten silicide, silicide 140 might be subsequently created as a nickel silicide without diffusing nickel into tungsten silicide 138.

Thus, different silicides may be used for different devices without additional masking steps. Additionally, this process is applicable to a plurality of devices having more than two overfill heights, with each subsequent dielectric etch exposing the next lower contact region.

After silicides 138 and 140 are created, contacts are formed in contact openings 134 and 136 and subsequent processing operations are performed, e.g., chemical mechanical planarization (CMP), etchback, or patterning.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described preferred embodiments of a multi-stage silicidation process (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A method for forming silicides on a plurality of device contact regions, the method comprising the steps of:
    forming a dielectric layer over the plurality of device contact regions on a semiconductor substrate;
    etching contact openings into the dielectric layer over each of the plurality of device contact regions to a depth sufficient to expose at least one of the plurality of device contact regions, but insufficient to expose at least one other of the plurality of device contact regions;
    forming a first silicide on the at least one of the plurality of device contact regions;
    extending the contact openings in the dielectric layer, via an etch selective to the first silicide on the at least one of the plurality of device contact regions, to expose the at least one other of the plurality of device contact regions; and
    forming a second silicide on the at least one other of the plurality of device contact regions.

2. The method of claim 1, wherein the step of etching the contact openings into the dielectric layer over each of the plurality of device contact regions comprises a timed reactive-ion etch (RIE).

3. The method of claim 2, wherein the timed reactive-ion etch is timed to be optimal for the at least one of the plurality of device contact regions.

4. The method of claim 1, wherein the step of forming the first silicide on the at least one of plurality of device contact regions comprises the steps of:
    depositing a metal containing layer within the contact openings;
    performing an annealing process to diffuse metal atoms from the metal containing layer into the at least one of the plurality of device contact regions; and
    removing unreacted portions of the metal containing layer.

5. The method of claim 1, wherein the first silicide and the second silicide are formed using one or more different metals or metal alloys.

6. The method of claim 1, wherein the step of forming the second silicide on the at least one other of the plurality of device contact regions comprises the steps of:
    depositing a metal containing layer within the contact openings;
    performing an annealing process at a temperature sufficient to diffuse metal atoms from the metal containing layer into the at least one other of the plurality of device contact regions, but insufficient to diffuse metal atoms from the metal containing layer into the first silicide;
    removing unreacted portions of the metal containing layer; and
    performing a high temperature thermal anneal.

7. The method of claim 1, wherein a metal or metal alloy used to form the first silicide is less diffusive than a metal or metal alloy used to form the second silicide.

8. The method of claim 1, further comprising the steps of:
    extending the contact openings in the dielectric layer, via an etch selective to the first and second silicides, to expose a device contact region at a depth greater than the at least one other device contact region; and
    forming a third silicide on the device contact region at the depth greater than the at least one other device contact region.

9. A method for forming multiple silicides optimized for different devices, the method comprising the steps of:
    forming a dielectric layer over a first device contact region and a second device contact region, wherein the first device contact region has a higher overfill than the second device contact region;
    depositing an etch-resistant mask on the dielectric layer with opening over both the first device contact region and the second device contact region;
    etching the dielectric layer through the openings in the etch-resistant mask to expose the first device contact region without exposing the second device contact region;
    forming a first silicide on the first device contact region, wherein the first silicide is optimized for a first device;
    etching the dielectric layer, selective to the first silicide, to expose the second device contact region; and
    forming a second silicide on the second device contact region using a low-temperature annealing technique so that the first silicide is not substantially altered during the formation of the second silicide when a mask is not used over the first silicide, wherein the second silicide is optimized for a second device.

10. The method of claim 9, further comprising the steps of:
    prior to the step of forming the dielectric layer, growing the first device contact region so that the first device contact region rises out of a semiconductor substrate more than the second device contact region.

11. The method of claim 9, wherein the step of forming the second silicide on the second device contact region using a low-temperature annealing technique comprises the steps of:
    depositing a metal-containing layer on the first silicide and on the second device contact region;
    performing an annealing process at a temperature sufficient to diffuse metal atoms from the metal-containing layer into the second device contact region but insufficient to diffuse metal atoms from the metal-containing layer into the first silicide; and
    removing unreacted portions of the metal-containing layer.

12. The method of claim 11, further comprising the step of, subsequent to removing the unreacted portions, performing a high-temperature anneal.

13. The method of claim 9, wherein the step of etching the dielectric layer to expose the first device contact region and the step of etching the dielectric layer to expose the second device contact region both comprise a timed reactive-ion etch (RIE).

14. A method for forming silicides on a plurality of conductive regions of a semiconductor substrate, the method comprising the steps of:
 providing a semiconductor substrate with a first conductive region and a second conductive region, wherein the first conductive region rises out of the semiconductor substrate farther than the second conductive region;
 depositing a dielectric layer over the first and second conductive regions;
 depositing an etch-resistant mask over the dielectric layer with openings over the first and second conductive regions;
 etching the dielectric layer through the openings in the etch-resistant mask, wherein the etching is a timed etch optimized to expose the first conductive region without exposing the second conductive region;
 forming a first silicide on the first conductive region;
 without a subsequent masking step, etching the dielectric layer, selective to the first silicide, wherein the etching is a timed etch optimized to expose the second conductive region; and
 without a subsequent masking step, forming a second silicide on the second conductive region.

15. The method of claim 14, wherein the step of forming the first silicide on the first conductive region comprises:
 depositing a metal-containing layer on the first conductive region; and
 performing an annealing process to form the first silicide from the metal-containing layer.

16. The method of claim 14, further comprising the step, subsequent to forming the first silicide and prior to etching the dielectric layer selective to the first silicide, removing the etch-resistant mask.

17. The method of claim 14, wherein etching the dielectric layer comprises a reactive-ion etch.

18. The method of claim 14, wherein the step of forming the second silicide comprises:
 performing a first annealing process at a temperature insufficient to diffuse metal atoms into the first silicide;
 removing excess metal; and
 performing a high-temperature anneal.

\* \* \* \* \*